US010020444B2

United States Patent
Tsubata et al.

(10) Patent No.: US 10,020,444 B2
(45) Date of Patent: Jul. 10, 2018

(54) MAGNETIC MEMORY DEVICE AND METHOD OF MANUFACTURING THE SAME

(71) Applicant: TOSHIBA MEMORY CORPORATION, Minato-ku, Tokyo (JP)

(72) Inventors: Shuichi Tsubata, Seoul (KR); Masatoshi Yoshikawa, Seoul (KR); Satoshi Seto, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 66 days.

(21) Appl. No.: 14/636,961

(22) Filed: Mar. 3, 2015

(65) Prior Publication Data

US 2016/0064648 A1 Mar. 3, 2016

Related U.S. Application Data

(60) Provisional application No. 62/043,534, filed on Aug. 29, 2014.

(51) Int. Cl.
| | |
|---|---|
| H01L 43/02 | (2006.01) |
| H01L 43/08 | (2006.01) |
| H01L 43/12 | (2006.01) |
| H01L 27/22 | (2006.01) |

(52) U.S. Cl.
CPC .............. *H01L 43/02* (2013.01); *H01L 43/08* (2013.01); *H01L 43/12* (2013.01); *H01L 27/228* (2013.01)

(58) Field of Classification Search
None
See application file for complete search history.

(56) References Cited

U.S. PATENT DOCUMENTS

| | | | | |
|---|---|---|---|---|
| 2004/0150016 | A1* | 8/2004 | Ooishi | B82Y 10/00 257/295 |
| 2008/0225577 | A1* | 9/2008 | Hosotani | B82Y 10/00 365/158 |
| 2008/0239930 | A1 | 10/2008 | Saito et al. | |
| 2010/0038617 | A1* | 2/2010 | Nakajima | H01L 27/24 257/2 |
| 2013/0119494 | A1* | 5/2013 | Li | H01L 43/08 257/421 |
| 2013/0313665 | A1 | 11/2013 | Rhie et al. | |
| 2014/0021426 | A1* | 1/2014 | Lee | H01L 43/02 257/1 |
| 2014/0063924 | A1* | 3/2014 | Nakai | G11C 11/16 365/158 |
| 2015/0332818 | A1* | 11/2015 | Fukami | H01F 10/265 428/680 |

\* cited by examiner

*Primary Examiner* — Fazli Erdem
*Assistant Examiner* — Scott R Wilson
(74) *Attorney, Agent, or Firm* — Holtz, Holtz & Volek PC (57) ABSTRACT

According to one embodiment, a magnetic memory device includes an interlayer insulating film, a bottom electrode formed in the interlayer insulating film, a buffer layer formed on the bottom electrode, and a stacked structure formed on the buffer layer and including a first magnetic layer functioning as a magnetic storage layer, wherein a portion of the buffer layer located on a central portion of the bottom electrode is thicker than a portion of the buffer layer located on a peripheral portion of the bottom electrode.

12 Claims, 10 Drawing Sheets

F I G. 1

F I G. 2

F I G. 3

F I G. 4

F I G. 5

F I G. 6

F I G. 7

F I G. 8

F I G. 9

F I G. 10

F I G. 11

F I G. 12

F I G. 13

F I G. 14

F I G. 15

F I G. 16

US 10,020,444 B2

MAGNETIC MEMORY DEVICE AND METHOD OF MANUFACTURING THE SAME

CROSS-REFERENCE TO RELATED APPLICATIONS

This application claims the benefit of U.S. Provisional Application No. 62/043,534, filed Aug. 29, 2014, the entire contents of which are incorporated herein by reference.

FIELD

Embodiments described herein relate generally to a magnetic memory device and a method of manufacturing the same.

BACKGROUND

Magnetic memory devices in which a magnetoresistive effect element is formed on a semiconducting substrate have been offered.

The above-described magnetoresistive effect element comprises a stacked structure of a plurality of layers including a magnetic layer. This stacked structure is formed on an underlying region including a bottom electrode. Therefore, it is desirable to form a well planarized underlying region for a high-performance magnetoresistive effect element.

Conventionally, however, it has been difficult to obtain a well planarized underlying region.

DETAILED DESCRIPTION

In general, according to one embodiment, a magnetic memory device includes: an interlayer insulating film; a bottom electrode formed in the interlayer insulating film; a buffer layer formed on the bottom electrode; and a stacked structure formed on the buffer layer and including a first magnetic layer functioning as a magnetic storage layer, wherein a portion of the buffer layer located on a central portion of the bottom electrode is thicker than a portion of the buffer layer located on a peripheral portion of the bottom electrode.

Embodiments will be described hereinafter with reference to the accompanying drawings.

Figure 9:
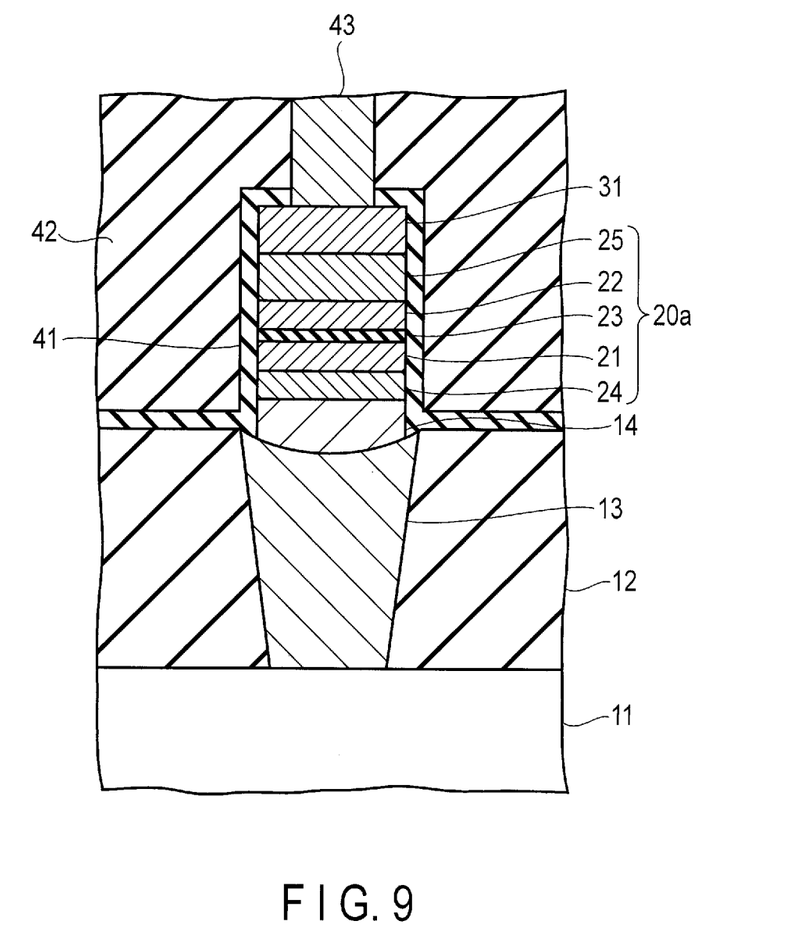
FIG. 9 is an exemplary sectional view of a part of the manufacturing method of the magnetic memory device of the embodiment.

FIG. 9 is an exemplary sectional view of the structure of the magnetic memory device of an embodiment.

The magnetic memory device of the present embodiment is a type which employs a magnetoresistive effect element. Note that a magnetoresistive effect element may also be called a magnetic tunnel junction (MTJ) element in the following descriptions.

In a surface region of a semiconductor substrate 11, a transistor (not shown) such as a select transistor is provided, and on the semiconductor substrate 11, an interlayer insulating film 12 with a hole is formed.

In the hole provided in the interlayer insulating film 12, a bottom electrode 13 of an MTJ element is formed. As will be described later, the bottom electrode 13 is formed by CMP. In this CMP treatment, dishing occurs, and thus the upper surface of the bottom electrode 13 is depressed. Consequently, when the interface of the bottom electrode 13 and the semiconducting substrate 11 is even, the central portion of the bottom electrode 13 is thinner than the peripheral portion of the bottom electrode 13.

On the bottom electrode 13 and the interlayer insulating film 12, a buffer layer 14 is formed. The buffer layer 14 is an amorphous layer. The upper surface of the buffer layer 14 is planarized. Further, the buffer layer 14 contains at least one of magnesium (Mg), calcium (Ca), scandium (Sc), titanium (Ti), yttrium (Y), zirconium (Zr), niobium (Nb), hafnium (Hf), tantalum (Ta) and boron (B). In the present embodiment, the buffer layer 14 primarily contains hafnium (Hf) and boron (B).

As described above, the upper surface of the bottom electrode 13 is depressed while the upper surface of the buffer layer 14 is planarized. Therefore, the portion of the buffer layer 14 located on the central portion of the bottom electrode 13 is thicker than the portion of the buffer layer 14 located on the peripheral portion of the bottom electrode 13. Further, the portion of the buffer layer 14 located on the central portion of the bottom electrode 13 is thicker than a portion of the buffer layer 14 located on the interlayer insulating film 12.

On the buffer layer 14, a stacked structure 20a comprising a magnetic layer functioning as a magnetic storage layer is formed. More specifically, the stacked structure 20a comprises a storage layer 21 (first magnetic layer) having variable magnetization, a reference layer 22 (second magnetic layer) having fixed magnetization, and a tunnel barrier layer 23 (non-magnetic layer) formed between the storage layer 21 and the reference layer 22. Further, the stacked structure 20a comprises an underlayer 24 formed between the buffer layer 14 and the storage layer 21. Still further, the stacked structure 20a comprises a shift cancelling layer 25 formed on the reference layer 22. The shift cancelling layer 25 serves to apply to the storage layer 21 a magnetic field acting in a direction opposite to the direction of the magnetic filed applied from the reference layer 22 to the storage layer 21.

The MTJ element having the above-described stacked structure 20a is a magnetic element having perpendicular magnetization. That is, the storage layer 21, the reference layer 22 and the shift cancelling layer 25 are magnetized in a direction perpendicular to the surfaces of these respective layers. When the direction of magnetization of the storage layer 21 and the direction of magnetization of the reference layer 22 are parallel, the MTJ element is in a low-resistance state. When the direction of magnetization of the storage layer 21 and the direction of magnetization of the reference layer 22 are antiparallel, the MTJ element is in a high-resistance state. It is possible to store binary 0 or 1 based on whether the MTJ is in the low-resistance state or in the high-resistance state. Further, it is possible to write binary 0 or 1 based on the direction of current flowing through the MTJ element.

On the stacked structure 20a, a cap layer 31 is provided. The cap layer 31 functions as a hard mask when the stacked structure 20a is formed.

The buffer layer 14, the stacked structure 20a and the cap layer 31 are covered with a protective insulating film 41. The protective insulating film 41 is covered with an interlayer insulating film 42. A hole is formed in the protective insulating film 41 and the interlayer insulating film 42, and in the hole, a top electrode 43 is formed.

As described above, in the magnetic memory device of the present embodiment, the portion of the buffer layer 14 located on the central portion of the bottom electrode 13 is thicker than the portion of the buffer layer 14 located on the peripheral portion of the bottom electrode 13. In other words, the upper surface of the bottom electrode 13 is depressed by dishing while the upper surface of the buffer layer 14 is planarized. Further, on the buffer layer 14 with the planarized upper surface, the stacked structure 20a is formed. Therefore, it is possible to form an excellent stacked structure 20a more reliably, and thus a high-performance MTJ element can be obtained.

Next, the manufacturing method of the above-described magnetic memory device will be described. FIGS. 1 to 9 are exemplary sectional views of the manufacturing method of the above-described magnetic memory device.

Figure 1:
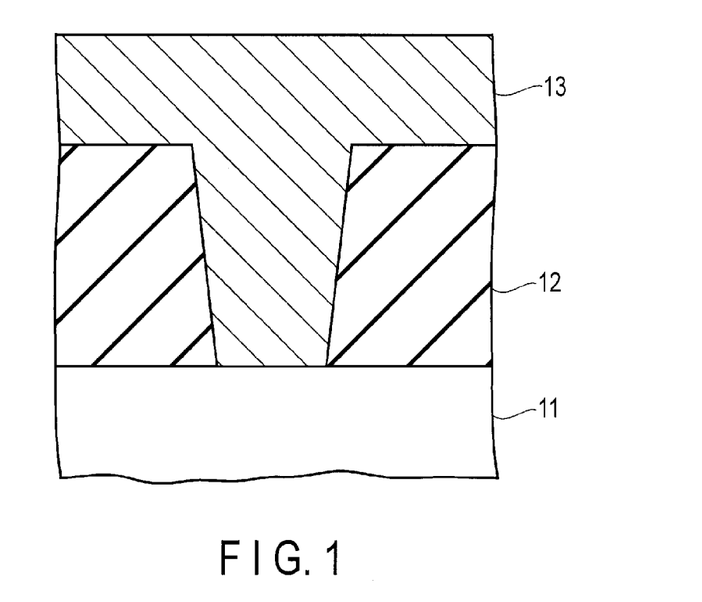
FIG. 1 is an exemplary sectional view of a part of the manufacturing method of a magnetic memory device of an embodiment.

First, as illustrated in FIG. 1, the interlayer insulating film 12 having a hole is formed on the semiconducting substrate 11. Then, the bottom electrode film 13 is formed in the hole provided in the interlayer insulating film 12, and on the interlayer insulating film 12.

Figure 2:
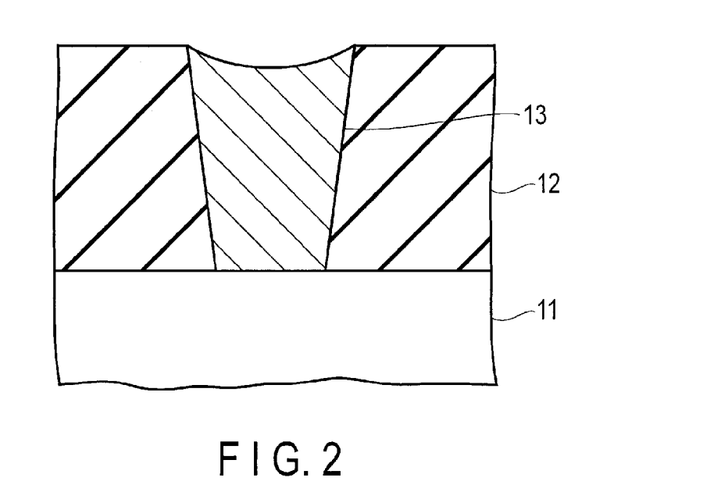
FIG. 2 is an exemplary sectional view of a part of the manufacturing method of the magnetic memory device of the embodiment.

Next, as illustrated in FIG. 2, the chemical mechanical polishing (CMP) is performed on the bottom electrode film. By doing so, the bottom electrode film on the interlayer insulating film 12 is removed, and the bottom electrode 13 is formed in the hole in the interlayer insulating film 12. In this CMP treatment, the upper surface of the bottom electrode 13 becomes depressed by dishing.

Figure 3:
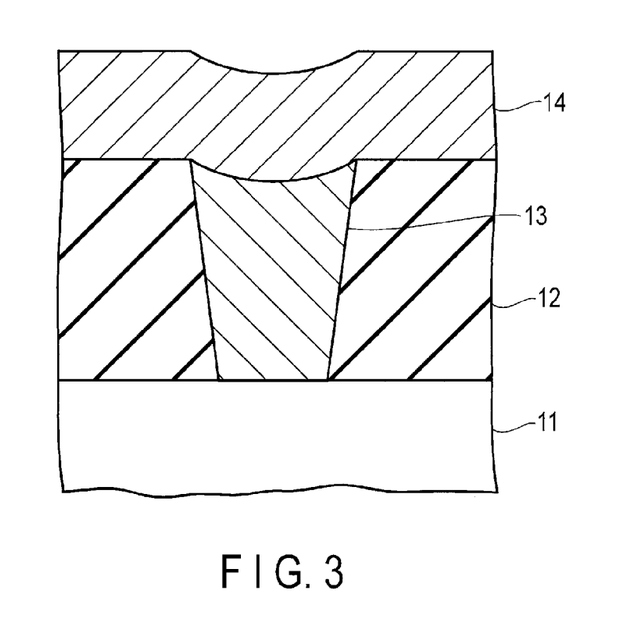
FIG. 3 is an exemplary sectional view of a part of the manufacturing method of the magnetic memory device of the embodiment.

Then, as illustrated in FIG. 3, the buffer layer 14 is formed on the interlayer insulating film 12 and the bottom electrode 13 by the physical vapor deposition (PVD). The thickness of the buffer layer 14 is about 30 to 50 nm. Since the upper surface of the bottom electrode 13 is depressed, the upper surface of the buffer layer 14 is depressed as well and thus uneven. The buffer layer 14 is an amorphous layer and contains at least one of magnesium (Mg), calcium (Ca), scandium (Sc), titanium (Ti), yttrium (Y), zirconium (Zr), niobium (Nb), hafnium (Hf), tantalum (Ta) and boron (B). In the present embodiment, the buffer layer 14 primarily contains hafnium (Hf) and boron (B).

Figure 4:
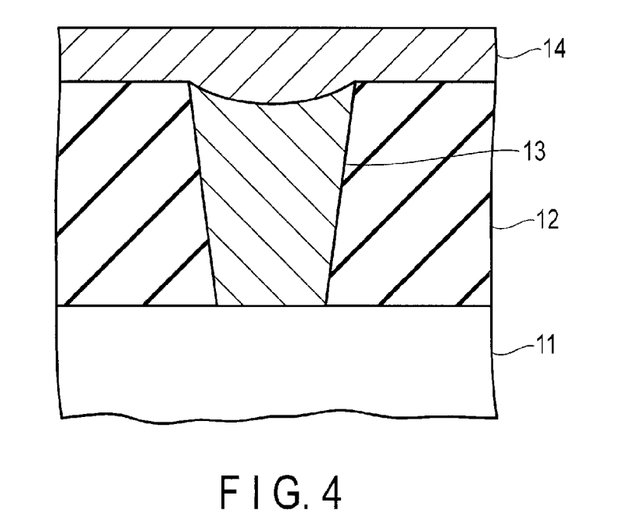
FIG. 4 is an exemplary sectional view of a part of the manufacturing method of the magnetic memory device of the embodiment.

Subsequently, as illustrated in FIG. 4, etch-back is performed to make the buffer layer 14 thinner. The surface of the buffer layer 14 subjected to etch-back and made thinner is planarized. The thickness of the planarized buffer layer 14 is about a few nanometers. The etch-back treatment (planarization treatment) is carried out by using ion beam etch (IBE) or a gas cluster ion beam (GCIB). In IBE treatment, a rare gas element such as argon (Ar) is used in applying an ion beam obliquely onto the surface of the buffer layer 14. In GCIB treatment, a cluster of a rare gas element such as argon (Ar) is used in applying a gas cluster ion beam perpendicular or obliquely onto the surface of the buffer layer 14.

By the above-described treatment, the buffer layer 14 is made thinner, and the upper surface of the buffer layer 14 is planarized. The portion of the thinned buffer layer 14 located on the central portion of the bottom electrode 13 is thicker than the portion of the thinned buffer layer 14 located on the peripheral portion of the bottom electrode 13. Further, the portion of the thinned buffer layer 14 located on the central portion of the bottom electrode 13 is thicker than the portion of the thinned buffer layer 14 located on the interlayer insulating film 12.

Figure 5:
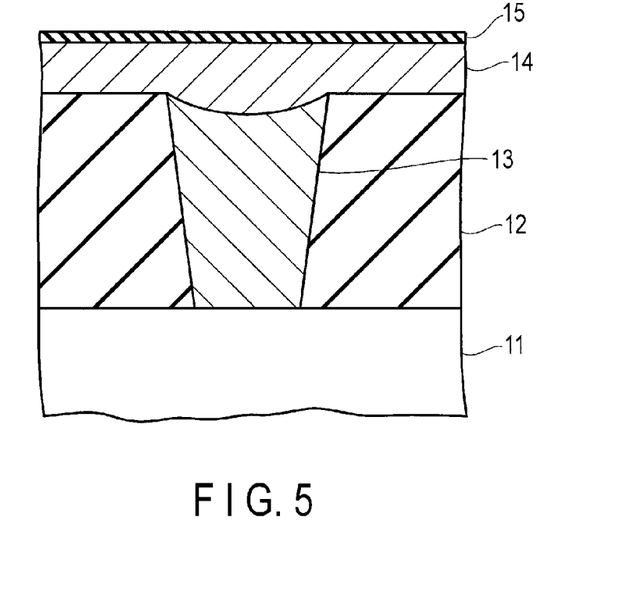
FIG. 5 is an exemplary sectional view of a part of the manufacturing method of the magnetic memory device of the embodiment.

Next, as illustrated in FIG. 5, the substrate provided with the buffer layer 14 is exposed to air, and thus a natural oxide film 15 is formed on the surface of the buffer layer 14. Instead of forming the natural oxide film 15, a nitriding film may be formed. It is preferable that the nitriding film be formed without being exposed to air.

Figure 6:
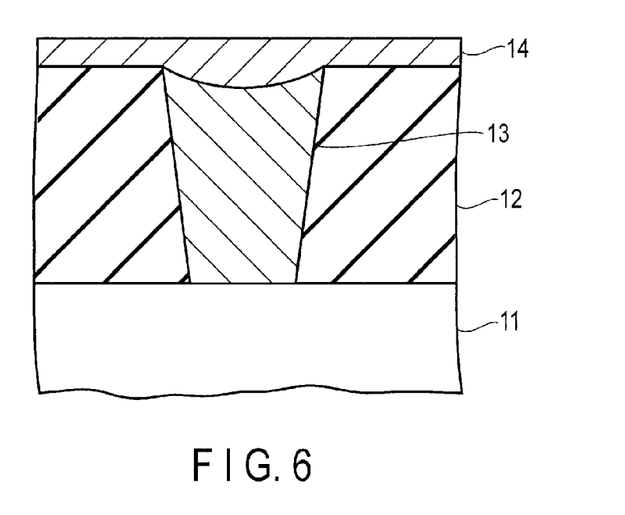
FIG. 6 is an exemplary sectional view of a part of the manufacturing method of the magnetic memory device of the embodiment.

Then, as illustrated in FIG. 6, the natural oxide film 15 is removed by etch-back. Even after the etch-back treatment, the buffer layer 14 is still planarized.

Figure 7:
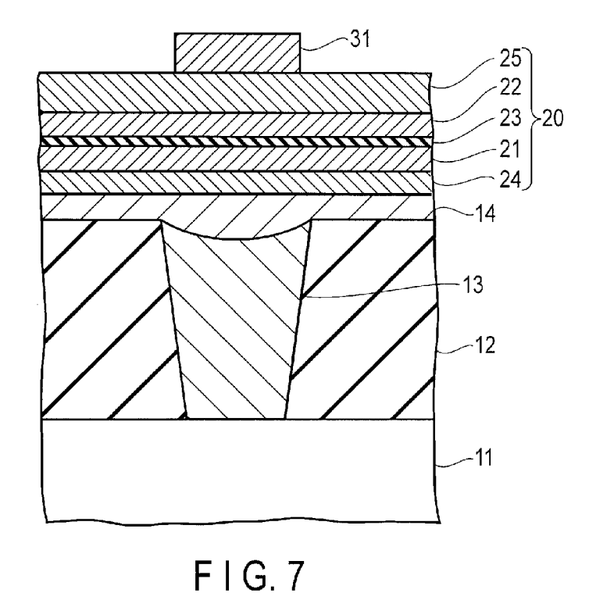
FIG. 7 is an exemplary sectional view of a part of the manufacturing method of the magnetic memory device of the embodiment.

Subsequently, as illustrated in FIG. 7, a stacked film 20 is formed on the thinned buffer layer 14 by in-situ treatment. That is, on the thinned buffer layer 14, the underlayer 24, the storage layer 21, the tunnel barrier layer 23, the reference layer 22 and the shift cancelling layer 25 are formed in order. Further, the pattern of the cap layer 31 is formed on the stacked film 20.

Figure 8:
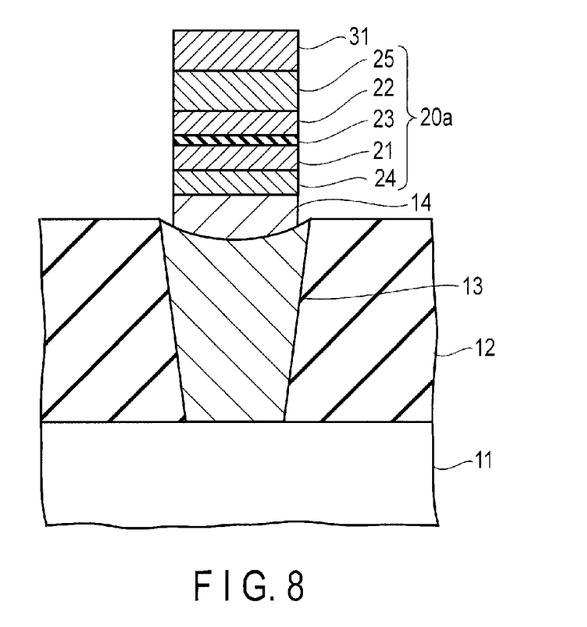
FIG. 8 is an exemplary sectional view of a part of the manufacturing method of the magnetic memory device of the embodiment.

Next, as illustrated in FIG. 8, by using the cap layer 31 as a hard mask, the stacked film 20 is patterned to form the stacked structure 20a. In this step, the buffer layer 14 except a portion located under the stack structure 20a is also removed. However, part of the buffer layer 14 may remain outside the portion located under the stack structure 20a.

Then, as illustrated in FIG. 9, the protective insulating film 41 is formed to cover the buffer layer 14, the stacked structure 20a and the cap layer 31. The interlayer insulating film 42 is then formed to cover the protective insulating film

41. Further, a hole is formed in the protective insulating film 41 and the interlayer insulating film 42, and in the hole, the top electrode 43 is formed.

By the above-described method, a magnetic memory device having the structure illustrated in FIG. 9 is manufactured.

As described above, in the manufacturing method of the magnetic memory device of the present embodiment, the buffer layer 14 is formed on the interlayer insulating film 12 and the bottom electrode 13, and the buffer layer 14 is made thinner to planarize the upper surface of the buffer layer 14. Therefore, it is possible to form the stacked structure 20*a* on the buffer layer 14 having the planarized upper surface, and thus a high-performance MTJ element can be reliably manufactured.

First Modified Example

Next, the first modified example of the present embodiment will be described. Note that, since basic matters are similar to those of the above-described embodiment, the matters described in the above embodiment are omitted.

Figure 14:
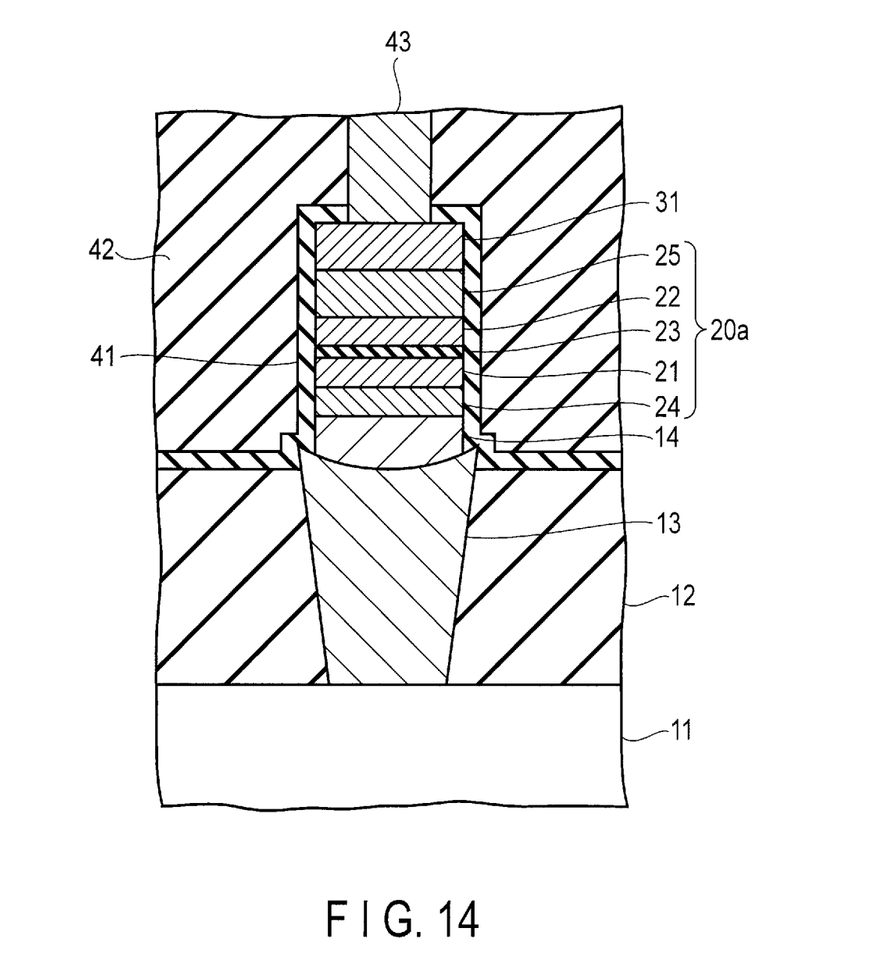
FIG. 14 is an exemplary sectional view of a part of the manufacturing method of the magnetic memory device of the first modified example of the embodiment.

FIG. 14 is an exemplary sectional view of the structure of the magnetic memory device of the present modified example. Note that the structural elements corresponding to those of FIG. 9 are designated by the same reference numbers, and the detailed descriptions thereof are omitted.

As illustrated in FIG. 14, the bottom electrode 13 in the present modified example projects from the interlayer insulating film 12. Therefore, the edge of the upper surface of the bottom electrode 13 is located higher than the upper surface of the interlayer insulating film 12. On this bottom electrode 13 and an interlayer insulating film 12, the buffer layer 14 is formed. In a manner similar to that of the above-described embodiment, the upper surface of the bottom electrode 13 is depressed, and the upper surface of the buffer layer 14 is planarized. Therefore, the portion of the buffer layer 14 located on the central portion of the bottom electrode 13 is thicker than the portion of the buffer layer 14 located on the peripheral portion of the bottom electrode 13 in a manner similar to that of the above-described embodiment.

Next, the manufacturing method of the magnetic memory device of the present modified example will be roughly described with reference to FIGS. 10 to 14.

Figure 10:
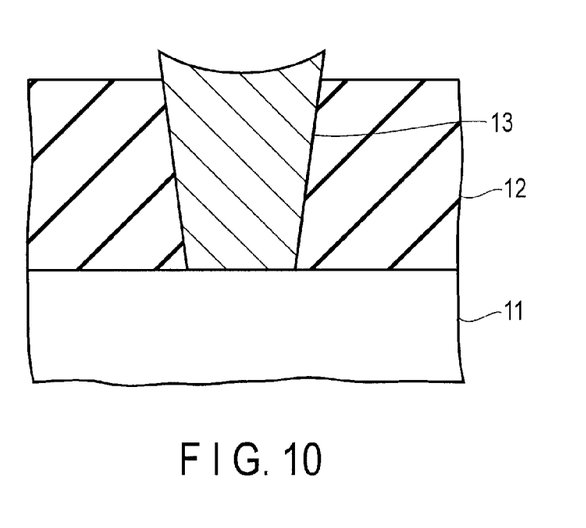
FIG. 10 is an exemplary sectional view of a part of the manufacturing method of a magnetic memory device of the first modified example of the embodiment.

First, processes similar to those of FIGS. 1 and 2 of the above-described embodiment are performed to form the structure illustrated in FIG. 10. In the present modified example, a structure in which the bottom electrode 13 projects from the interlayer insulating film 12 is formed.

Figure 11:
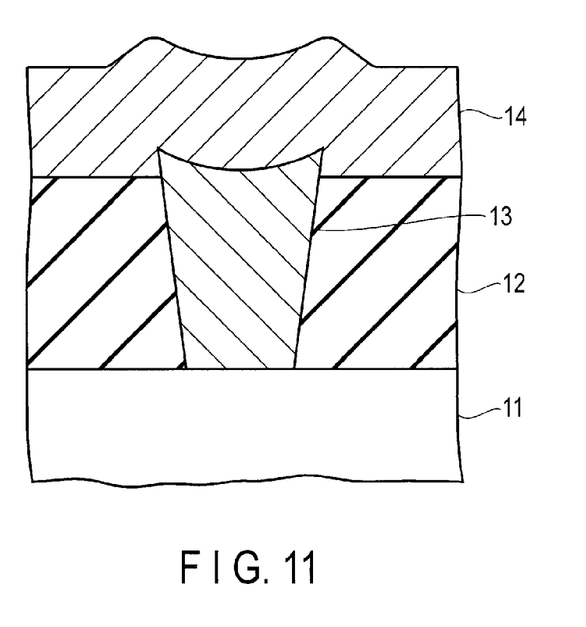
FIG. 11 is an exemplary sectional view of a part of the manufacturing method of the magnetic memory device of the first modified example of the embodiment.

Then, a process similar to that of FIG. 3 of the above-described embodiment is performed to form the structure illustrated in FIG. 11. As illustrated in FIG. 11, the upper surface of the buffer layer 14 is uneven.

Figure 12:
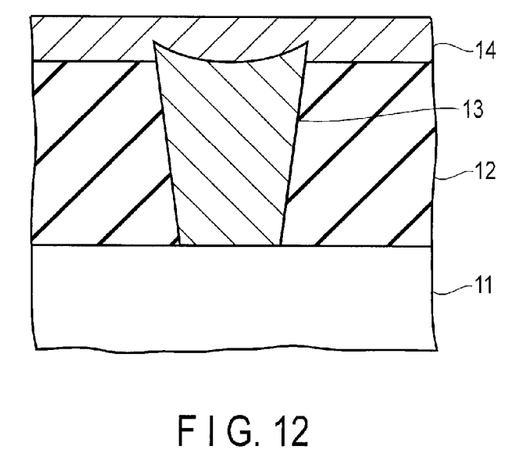
FIG. 12 is an exemplary sectional view of a part of the manufacturing method of the magnetic memory device of the first modified example of the embodiment.

Subsequently, processes similar to those of FIGS. 4 to 6 of the above-described embodiment are performed to form the structure illustrated in FIG. 12. As illustrated in FIG. 12, the upper surface of the buffer layer 14 is planarized.

Figure 13:
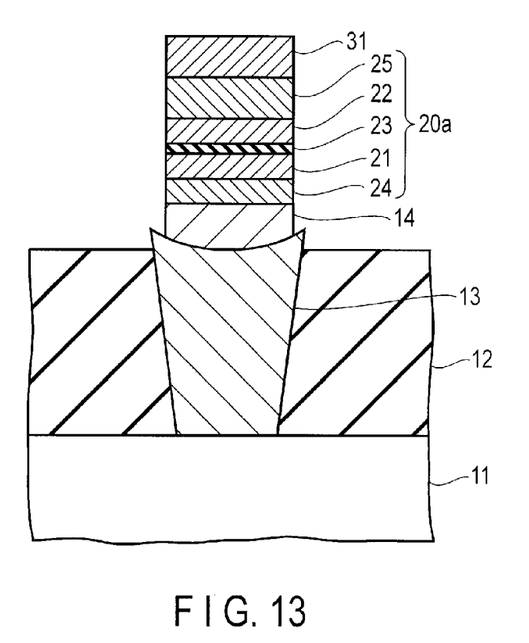
FIG. 13 is an exemplary sectional view of a part of the manufacturing method of the magnetic memory device of the first modified example of the embodiment.

Processes similar to those of FIGS. 7 and 8 of the above-described embodiment are then performed to form the structure illustrated in FIG. 13. Also in the present modified example, the stacked structure 20*a* is formed on the planarized buffer layer 14.

Next, a process similar to that of FIG. 9 of the above-described embodiment is performed to manufacture a magnetic memory device having the structure illustrated in FIG. 14.

Also in the present modified example, it is possible to obtain an effect similar to that produced by the above-described embodiment. That is, even in a case where the bottom electrode 13 projects from the interlayer insulating film 12, the buffer layer 14 having the planarized upper surface is formed and the stacked structure 20*a* is then formed on this buffer layer 14, and thus it is possible to manufacture a high-performance MTJ element.

Second Modified Example

Next, the second modified example of the present embodiment will be described. Note that, since basic matters are similar to those of the above-described embodiment, the matters described in the above-described embodiment are omitted.

Figure 15:
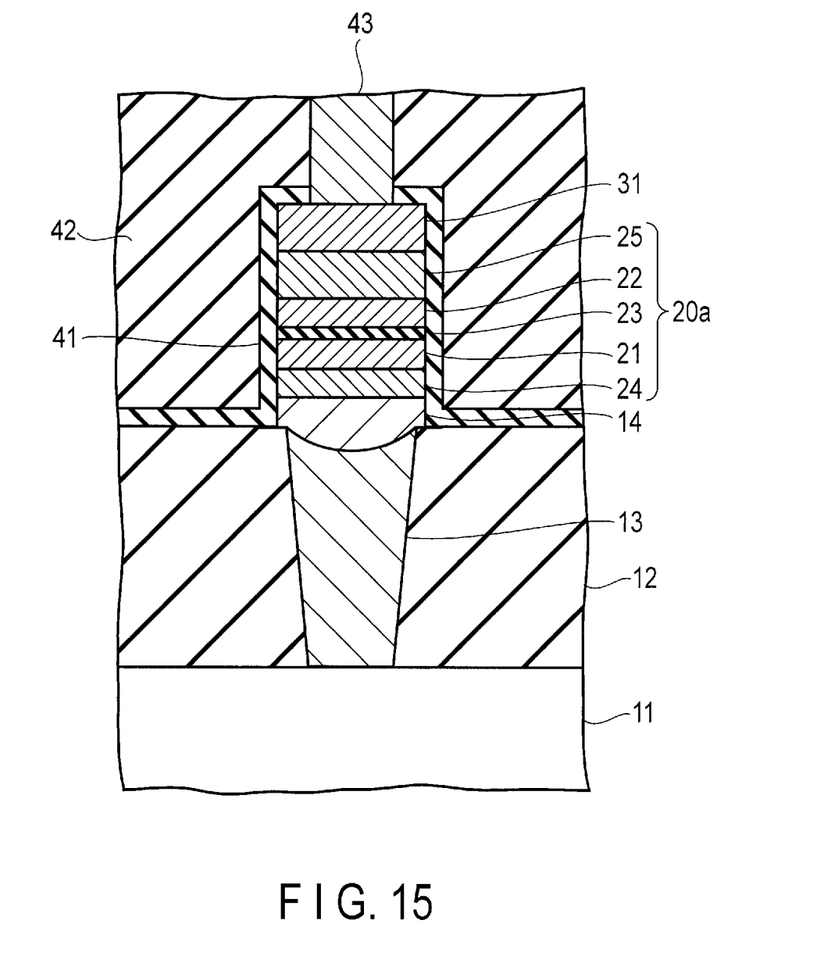
FIG. 15 is an exemplary sectional view of a magnetic memory device of the second modified example of the embodiment.

FIG. 15 is an exemplary sectional view of the structure of the magnetic memory device of the present modified example. Note that the structural elements corresponding to those of FIG. 9 are designated by the same reference numbers, and the detailed descriptions thereof are omitted.

In the above-described embodiment, the planar size of the stacked structure 20*a* is smaller than the planar size of the bottom electrode 13 (size of the upper surface of the bottom electrode 13). In the present modified example, the planar size of the stacked structure 20*a* is larger than the planar size of the bottom electrode 13. Therefore, the edge of the stacked structure 20*a* is located outside of the edge of the bottom electrode 13 (edge of the upper surface of the bottom electrode 13).

Also in the present modified example, it is possible to obtain an effect similar to that produced by the above-described embodiment. That is, even in a case where the planar size of the stacked structure 20*a* is larger than the planar size of the bottom electrode 13, the buffer layer 14 having the planarized upper surface is formed and the stacked structure 20*a* is then formed on this buffer layer 14, and thus it is possible to manufacture a high-performance MTJ element.

Figure 16:
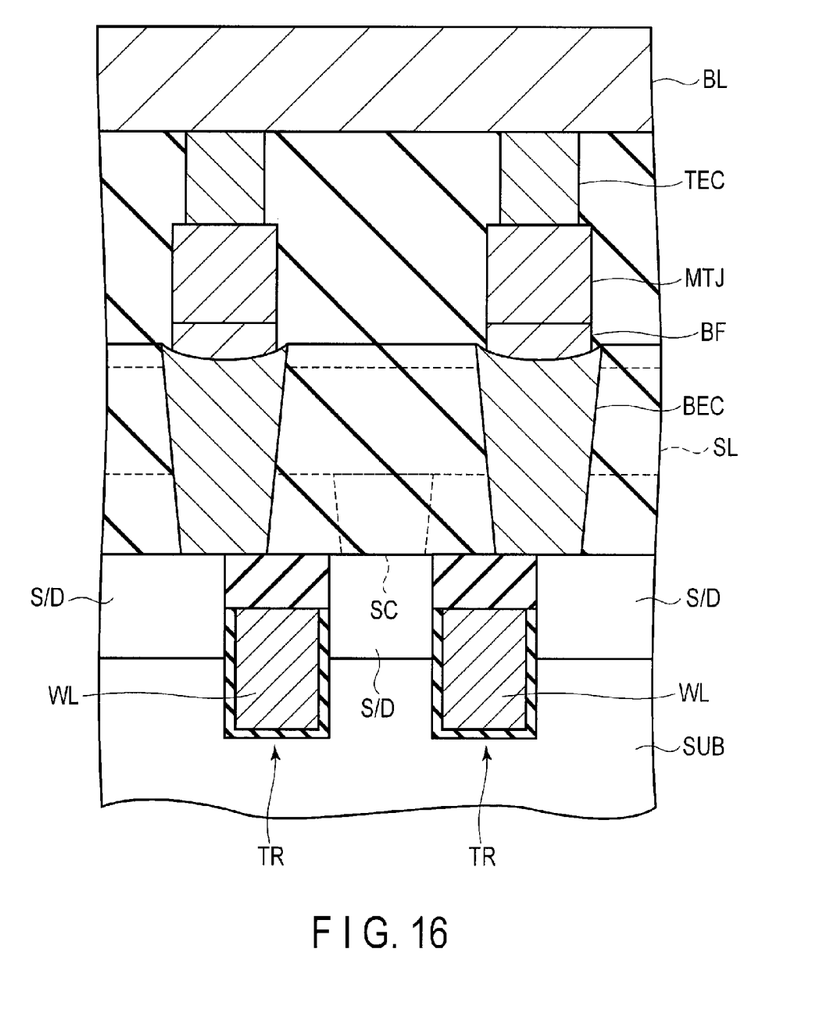
FIG. 16 is a view schematically showing a general structure of a semiconductor integrated circuit device in which a magnetoresistive effect element is employed.

FIG. 16 is a view schematically showing a general structure of a semiconductor integrated circuit device in which a magnetoresistive effect element (MTJ element) is employed.

A buried gate type MOS transistor TR is formed in a semiconductor substrate SUB. A gate electrode of the MOS transistor TR is used as a word line WL. A bottom electrode BEC is connected to one of source/drain regions S/D of the MOS transistor TR, and a source line contact SC is connected to the other of the source/drain regions S/D.

A magnetoresistive effect element MTJ is formed on the bottom electrode BEC, and a top electrode TEC is formed on the magnetoresistive effect element MTJ. A buffer layer BF is formed between the bottom electrode BEC and the magnetoresistive effect element MTJ. A bit line BL is connected to the top electrode TEC. A source line SL is connected to the source line contact SC.

An excellent semiconductor integrated circuit device can be obtained by applying the structure and the method described in the above embodiment to the semiconductor integrated circuit device shown in FIG. 16.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a semiconductor substrate;
an interlayer insulating film;
a bottom electrode formed in the interlayer insulating film;
a buffer layer formed on the bottom electrode, the buffer layer being an amorphous layer; and
an MTJ element having a stacked structure and formed on the buffer layer,
wherein the bottom electrode and the buffer layer are provided between the semiconductor substrate and the MTJ element,
wherein the buffer layer has a convex bottom surface, and
wherein a portion of the buffer layer located on a central portion of the bottom electrode is thicker than a portion of the buffer layer located on a peripheral portion of the bottom electrode.

2. The device of claim 1, wherein an upper surface of the buffer layer is planarized.

3. The device of claim 1, wherein the buffer layer contains at least one of magnesium (Mg), calcium (Ca), scandium (Sc), titanium (Ti), yttrium (Y), zirconium (Zr), niobium (Nb), hafnium (Hf), tantalum (Ta) and boron (B).

4. The device of claim 1, wherein an upper surface of the bottom electrode is depressed.

5. The device of claim 1, wherein the buffer layer is formed also on the interlayer insulating film.

6. The device of claim 5, wherein the portion of the buffer layer located on the central portion of the bottom electrode is thicker than a portion of the buffer layer located on the interlayer insulating film.

7. The device of claim 1, wherein the bottom electrode projects from the interlayer insulating film.

8. The device of claim 1, wherein the stacked structure includes a first magnetic layer with variable magnetization, a second magnetic layer with fixed magnetization, and a non-magnetic layer formed between the first magnetic layer and the second magnetic layer.

9. The device of claim 1, wherein the buffer layer is formed directly on the bottom electrode.

10. The device of claim 1, wherein no magnetic layer is provided between the bottom electrode and the buffer layer.

11. The device of claim 1, wherein both the portion of the buffer layer located on the central portion of the bottom electrode and the portion of the buffer layer located on the peripheral portion of the bottom electrode directly contact the bottom electrode.

12. The device of claim 1, wherein the MTJ element includes a first magnetic layer functioning as a magnetic storage layer.

* * * * *